United States Patent
Lipan et al.

(10) Patent No.: US 7,215,211 B2
(45) Date of Patent: May 8, 2007

(54) PRESCALER FOR A FRACTIONAL-N SYNTHESIZER

(75) Inventors: Tudor Lipan, Ottawa (CA); Ardeshir Namdar-Mehdiabadi, Gloucester (CA)

(73) Assignee: Skyworks Solutions, Inc., Irvine, CA (US)

( * ) Notice: Subject to any disclaimer, the term of this patent is extended or adjusted under 35 U.S.C. 154(b) by 85 days.

(21) Appl. No.: 11/150,668

(22) Filed: Jun. 10, 2005

(65) Prior Publication Data

US 2006/0280280 A1 Dec. 14, 2006

(51) Int. Cl.
*H03L 7/00* (2006.01)

(52) U.S. Cl. .................... 331/34; 331/16; 331/177 R; 327/117; 377/47; 377/48

(58) Field of Classification Search ............... 377/47, 377/48; 327/117; 331/34, 177 R, 16
See application file for complete search history.

(56) References Cited

U.S. PATENT DOCUMENTS 6,369,623 B1 * 4/2002 Heinen ................. 327/117

* cited by examiner

*Primary Examiner*—Arnold Kinkead

(57) ABSTRACT

An (N−1)/N prescaler is provided, where N is an S power of 2. The prescaler uses only S flip-flops. The (N−1)/N prescaler receives a clock input from a high frequency oscillator, and provides an output line to a counter. The (N−1)/N prescaler receives a divide-by-(N−1) signal from the counter, and responsive to the divide signal, causes the prescaler to divide by a factor of (N−1); otherwise, the prescaler divides by a factor of N.

20 Claims, 6 Drawing Sheets

PRESCALER FOR A FRACTIONAL-N SYNTHESIZER

BACKGROUND

The field of the present invention is electronic circuits for frequency synthesis. More particularly, the present invention relates to a prescaler electronic circuit for use with a fractional-N synthesizer.

Wireless communication systems transmit and receive modulated radio frequency (RF) signals, generally in accord with one or more telecommunications standards. These telecommunication standards, such as GSM, CDMA, CDMA2000, PDC, PHS, and others, generally set out specific and narrow bands of frequency operation. In order to maintain compliance with the frequency standards, wireless transceivers may use a crystal controlled oscillator to provide a highly accurate and stable frequency source, which controls and maintains the frequency output of a higher frequency local oscillator, such as a voltage controlled oscillator (VCO). In operation, the wireless transceiver may often need to change channels or modes, and therefore the modulation frequency generated by the VCO.

The high frequency VCO generates a high frequency signal at the desired modulation frequency, which is defined in the implemented telecommunication standard. The modulation signal may be, for example, several hundred Megahertz, with some telecommunication standards now operating in the Gigahertz frequencies. Although the VCO generates high frequency signals, the VCO is a relatively unstable frequency source, and is subject, for example, to frequency drift and accuracy errors. In order to increase the accuracy and stability of the VCO, the VCO uses the crystal controlled oscillator as a frequency reference. To do so, a prescaler circuit may be used to divide the VCO signal to a desired lower frequency. A controller in the wireless device determines the desired ratio between the reference oscillator and the VCO, and generates an appropriate divide ratio. Using the selected divide ratio, the local VCO signal is divided to a lower frequency, which is then locked to the reference signal from the crystal controlled oscillator, often by using a standard phase locked loop (PLL) circuit. If there is a difference in frequency between the reference signal and the divided signal, then a feedback loop is used to appropriately adjust the frequency of the VCO. In this way, the VCO frequency is adjusted according to the divide ratio used in the prescaler. In another use, the divide ratio of the prescaler may be changed to generate different signal frequencies. In this way, different lower frequency signals may be readily available for use.

A prescaler typically has two available divide ratios and has an input control line that allows a control circuit to set a first mode where the prescaler divides by a first divide ratio, or set a second mode where the prescaler divides by a second divide ratio. Since the prescaler has at least some components that operate at the frequency of the local oscillator signal, the prescaler circuit needs to be implemented with minimal components, and with structures selected to accommodate timing and power needs. As oscillator frequencies increase, and the demands for stable and accurate frequency sources increase, there are more demands being placed on prescalers.

A typical known prescaler is arranged to divide either at an N factor or at an (N+1) factor. Such a prescaler is often referred to as an N/(N+1) prescaler. Common prescaler values are 4/5; 8/9; and 16/17. In using a prescaler, a control circuit instructs the prescaler to divide an input frequency by a particular divide ratio. The magnitude and range of the required divide ratios are determined according to the frequency of the reference oscillator, the frequency of the VCO, and the requirements of the communication standard that is to be implemented. More particularly, the required communication standard is likely to define specific frequency bands and channel separations that a radio device must use. In practice, it is usual to define the divide ratios according to the minimum channel spacing required by the communication standard. In order to efficiently implement the radio, and to fully use the available frequency spectrum, the divide ratios are almost always contiguous. That is, the prescaler is able to implement every divide ratio at or above a given minimum divide ratio. For example, an 8/9 prescaler is able to implement divide ratios contiguously from a minimum divide ratio of 56. For example, the 8/9 prescaler can divide by 56, 57, 58, 59, and every integer value thereafter. Although the 8/9 prescaler may implement some divide ratios less than 56, it cannot do so contiguously. For example, the 8/9 prescaler cannot practically implement a divide ratio of 55. In a similar manner, the 4/5 prescaler is contiguous from a minimum divide ratio of 12, and the 16/17 prescaler is contiguous from a minimum divide ratio of 240.

To reduce power consumption and space requirements, known prescalers are designed to conserve components, power, and space. Over the years, standard designs have evolved which more efficiently use logic components. For example, the 4/5 prescaler can be implemented using 3 flip-flops and associated logic gates, the 8/9 prescaler can now be implemented using 4 flip-flops and associated logic gates, and the 16/17 prescaler can now be implemented using 5 flip-flops and associated logic gates. Further, it is important to consider how much circuitry must operate at the frequency of the VCO, since the timing requirements for these components tend to be critical, as well as having increased power needs. In known designs, several of the flip-flops typically operate at the VCO frequency. For example, in the 8/9 prescaler, which has a total of 4 flip-flops, 3 of those flip-flops operate at full VCO frequency.

In another consideration, prescalers are designed to implement particularly efficient division algorithms. For example, N is almost always selected to be a power of 2, since this allows a simple bit shift to implement a divide-by-2 function. Other implementations would become unnecessarily complex. However, the selection of simplified electronic arrangements limits the flexibility of the division algorithm. Take for example the division algorithm for a known 8/9 prescaler. Any natural number may be written as $D=M*8+A$, where M and A are natural, and A is in the range of 0 and 7. As understood by one skilled in the art, a natural number is an integer which is positive or zero. However, implementing a practical 8/9 prescaler usually involves a more restrictive algorithm, which may be written as $D=(M-A)*8+A*9$. This algorithm is the division process as actually implemented in the electronic components, and illustrates some of the limitations inherent in the 8/9 prescaler. For example, the electronic components are only able to act on natural numbers, and since A has a maximum value of 7, then M must have a minimum value of 7. Otherwise, the term (M−A) results in a negative number. Using this implementation, the minimum value of D is 56 (M=7 and A=0).

Therefore, there exists a need for a frequency prescaler that provides adequate frequency reduction, required frequency resolution, and that can be efficiently and robustly implemented.

SUMMARY

Briefly, a (N−1)/N prescaler is provided, where N is an S power of 2. The prescaler uses only S flip-flops. The (N−1)/N prescaler receives a clock input from a high frequency oscillator, and provides an output line to a counter. The (N−1)/N prescaler receives a divide-by-(N−1) signal from the counter, and responsive to the divide signal, causes the prescaler to divide by a factor of (N−1); otherwise, the prescaler divides by a factor of N.

BRIEF DESCRIPTION OF THE DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views. It will also be understood that certain components and details may not appear in the figures to assist in more clearly describing the invention.

DETAILED DESCRIPTION

Figure 1:
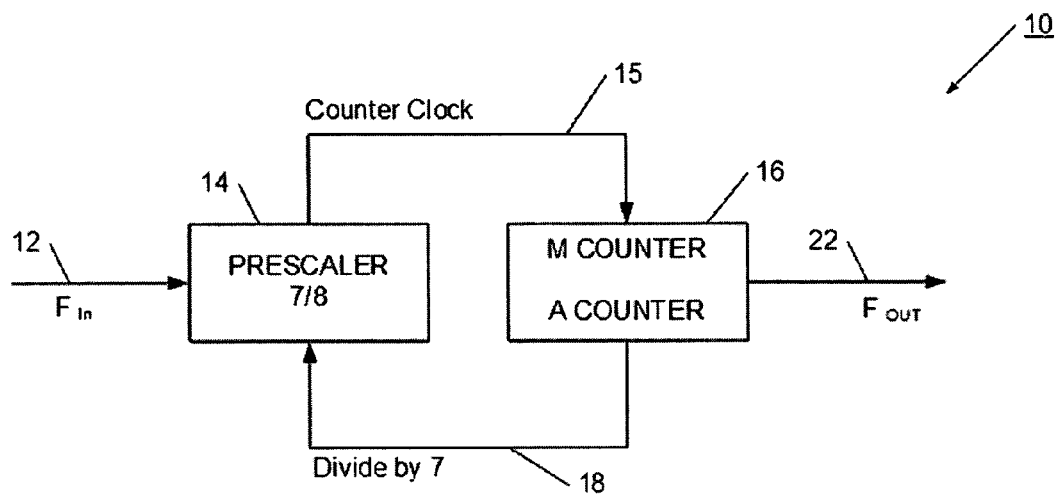
FIG. 1 is a block diagram of a prescaler and counter system in accordance with the present invention.

Referring now to FIG. 1, a prescaler system is shown. The prescaler is shown as a 7/8 prescaler 10. Prescaler 10 receives a signal 12 operating at a high frequency. The prescaler module 14 divides the input frequency 12 by either 7 or 8 responsive to the counters 16. An output signal from the prescaler 14 is received as the counter clock 15 for the counters 16. In one arrangement, the counters 16 include an M counter and an A counter. The counter 16 has been predefined to divide by a divide ratio. In this regard, the M counter and the A counter cooperate to generate a divide-by-7 signal 18 that implements the desired divide ratio. When the prescaler 14 receives the divide-by-7 signal 18, the prescaler 14 divides the input frequency 12 by 7. When, however, the divide-by-7 signal 18 is not present, the prescaler 14 divides the input frequency numeral 12 by 8.

The prescaler 10 generates an output signal 22 which represents the input signal 12 divided by the defined divide ratio.

In one application, the prescaler 10 operates as part of a wireless radio system. In this regard, the input signal 12 is received from a local oscillator, such as a voltage controlled oscillator (VCO). The VCO is typically constructed to provide a high-frequency signal. However the VCO signal often lacks the necessary stability and accuracy as required by a wireless radio system. Accordingly, the wireless radio also has a highly accurate reference oscillator, such as a crystal controlled oscillator. The crystal controlled oscillator operates at a frequency much lower than the VCO. Accordingly, the VCO output signal must be divided by a divide ratio to be compared to the highly accurate reference signal provided by the crystal controlled oscillator. The wireless radio has a transmit/receive controller which provides the desired divide ratio to the counters 16. For example, the transmit/receive controller determines a divide ratio dependent on particular communication standards, bandwidths, or channel spacing. The output signal 22 may then be compared to the highly accurate reference signal. Typically, this comparison is made using a phase lock loop (PLL). More particularly, in one embodiment the PLL generates a voltage responsive to a difference in the phase between the output signal 22 and the highly accurate reference signal. The voltage is used to adjust the frequency output of the voltage controlled oscillator (VCO), which is providing the input signal 12. In this way, the prescaler system can assist in efficiently and accurately holding a VCO to a desired frequency.

The 7/8 prescaler 10 is constructed as an (N−1)/N prescaler according to the following relationship: $N=2^S$, where S is a non-0 positive integer. Accordingly, in prescaler 14:

N=8;

S=3; and (N−1)=7

In this configuration, the 7/8 prescaler is capable of dividing by either a smaller factor 7 or a larger factor 8. By selecting the larger factor to be a power of 2, the prescaler 10 may be constructed in a particularly efficient arrangement. For example, the prescaler has an extended range of contiguous divide ratios, as well as a reduced component count as compared to the known prescalers. In one arrangement, prescaler 10 enables a minimum divide ratio of 42, and the prescaler 14 may be implemented using only 3 flip-flops and supporting circuitry. In a specific design, only 2 of the flip-flops operate at the VCO frequency.

Figure 2:
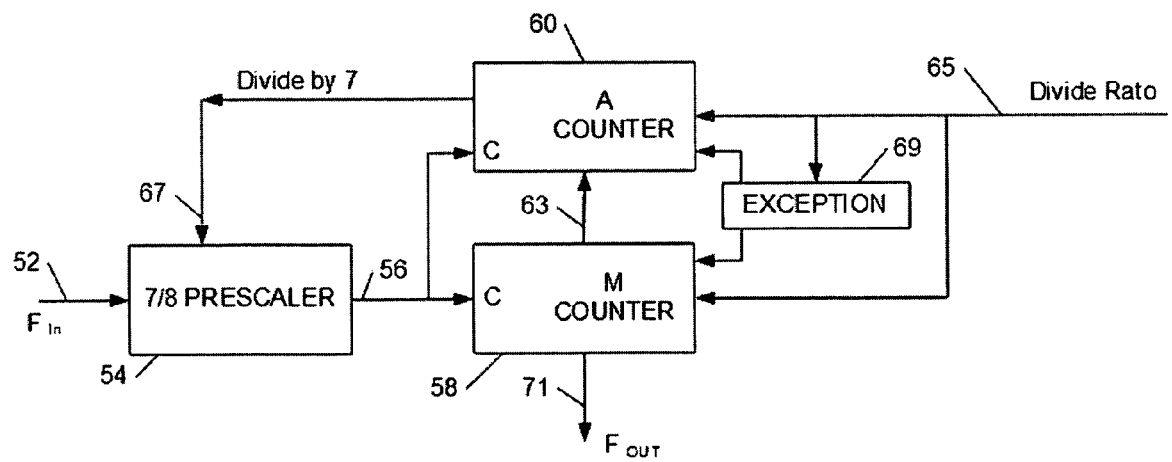
FIG. 2 is a block diagram of a prescaler and counter system in accordance with the present invention.

Referring now to FIG. 2, a prescaler system 50 is illustrated. Prescaler system 50 receives an input signal 52 from a high frequency source, such as a voltage controlled oscillator (VCO). The input signal 52 is divided in a prescaler 54 by a factor of either 7 or 8, responsive to a signal 67. The output 56 from the prescaler 54 is received as the clock inputs to a set of counters. The counters may include an M counter 58 and an A counter 60. A divide ratio 65 is received from supporting circuitry such as a transmit/receive controller. The divide ratio 65 is used to set the particular values in the counters 58 and 60 to implement the desired divide ratio. The prescaler 54 divides by a factor of 7 until the divide-by-7 signal 67 received from the A counter is deasserted. Upon the divide-by-7 signal 67 being deasserted (goes from logic 1 to logic 0), the prescaler 54 divides the input frequency 52 by a factor of 8. The counters generate an output signal 71 which implements the divide ratio 65. The prescaler system 50 may also include exception circuitry 69.

The exception circuitry 69 detects when the divide ratio 65 is set to a value where the normal process for setting the counters fails to implement a natural solution. The exception circuitry 69 forces the counters 58 and 60 into a condition to implement the desired divide ratio 65. For a 7/8 prescaler system 50, the normal process of setting the counters is not effective for a divide ratio of 48. More particularly, if the counters are set in their usual manner, an incorrect solution results. Accordingly, the exception circuitry 69 is set to detect when the divide ratio is set at 48, and force the counters 58 and 60 into a condition to implement a natural divide ratio of 48.

Figure 3:
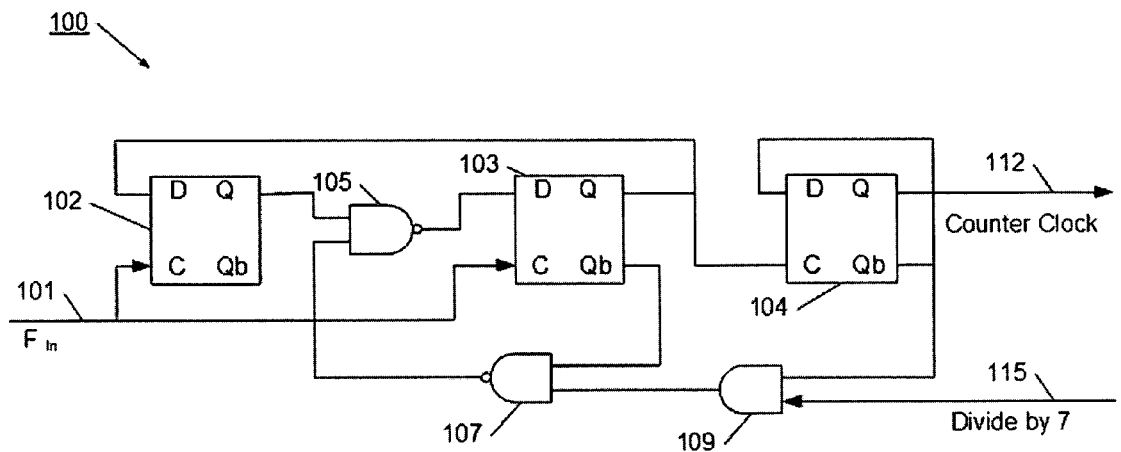
FIG. 3 is a schematic diagram of a prescaler in accordance with the present invention.

Referring now to FIG. 3, a prescaler module 100 is illustrated. Prescaler module 100 may be used, for example, as part of a prescaler system, such as prescaler system 10 or 50 previously described. Prescaler module 100 is arranged to implement a 7/8 prescaler. Advantageously, the 7/8 prescaler 100 is implemented using only 3 flip-flops, along with some supporting logic gates and circuitry. Further, the 7/8 prescaler 100 is capable of the implementing a minimum division ratio of 42, which extends the utility of the prescaler module 100. Since the 7/8 prescaler 100 uses fewer flip-flops then known designs, the 7/8 prescaler 100 has better overall performance and reduced timing requirements. Also, the reduced component count allows the prescaler 100 to be implemented in less space, and uses less power, than known designs.

As illustrated in FIG. 3, the 7/8 prescaler may be implemented using only 3 D flip-flops (102, 103, & 104), 2 NAND gates (105 & 107), and 1 AND gate (109). As generally known in the electronic arts, a D flip-flop operates so that when a logic 0 to logic 1 transition occurs on its clock, the new output Q takes on the state of the D input at the moment of the clock edge. The design and use of D flip-flops is well known, so will not be discussed in detail. In prescaler 100, and input frequency signal 101 is received as the clock input to flip-flops 102 and 103. The output from the flip-flop 102 is received into NAND gate 105. The output from NAND gate 105 is received as the data input to flip-flop 103. The output from the flip-flop 103 is received as the data input to flip-flop 102, as well as the clock input for flip-flop 104. The Q output from flip-flop 104 generates a counter clock signal 112, which is sent to associated counter circuitry (not shown). The Qb output from flip-flop 104 is received as the data input to flip-flop 104, as well as one of the inputs to AND gate 109. The other input to AND gate 109 is a divide-by-7 signal 115 which is received from the associated counter circuitry. The output from the AND gate 109 is used as an input to the NAND gate 107. The output from the NAND gate 107 is received as an input to NAND gate 105. In operation, the 3 flip-flops cooperate to implement a divided-by-8 divide factor. However, when a divide-by-7 signal 115 is received, and the Qb of flip-flop 104 is high (Q is low), then the output from AND gate 109 transitions to a high logic value. In this case, and when the Qb of flip-flop 103 is high (Q is low), then the output from NAND 107 will transition to a low state. The low state from NAND 107 causes the output from NAND 105 to be held at a high state, irrespective of the output from flip-flop 102. This action causes the prescaler module 102 to divide by a factor of 7 while the divide by 7 signal 115 is high. Otherwise, when signal 115 is low, the prescaler divides by a factor of 8.

Figure 4:
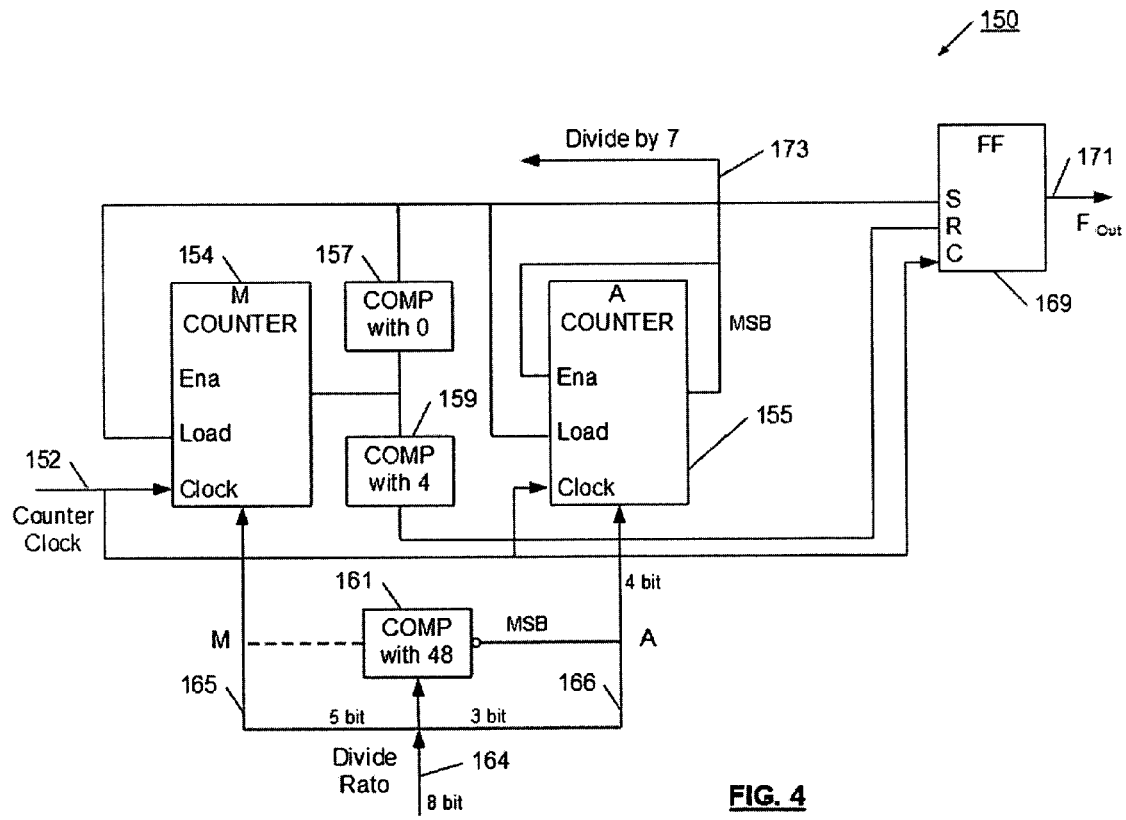
FIG. 4 is a schematic diagram of a counter in accordance with the present invention.

The prescaler module 100 cooperates with counter circuitry, such as counter circuitry 150 illustrated in FIG. 4. A counter clock signal 152 is received by M counter 154 and A counter 155. The counter clock signal 152 may be received from a 7/8 prescaler, such as a 7/8 prescaler 100 described with reference to FIG. 3. The M counter 154 is a 5 bit decrementing counter having a synchronous load input. The A counter 155 is a 4 bit incrementing counter with synchronous load and synchronous enable inputs. A divide ratio 164 is an 8 bit number received from, for example, a transmit/receive portion of the radio. The least significant 3 bits 166 of the divide ratio are used to load the A counter 155. The most significant bit of the A counter is always loaded with 1, except when the divide ratio is set to the exception value: 48. The most significant 5 bits 165 of the divide ratio are used to load the M counter. In operation, the M counter decrements from its loaded value 165, and outputs a current value to comparators 157 and 159. When the output from the M counter 154 is 4, the comparator 159 sets the reset input to SR flip-flop 169 so that the output signal 171 is low. Then, when the output from the M counter 154 reaches 0, the comparator 157 sets the S input to the SR flip-flop so that the output signal 171 is high. Also, each time the M counter reaches 0, the comparator 157 causes the value 165 to be reloaded. In this way, the output signal 171 generates pulses responsive to a count cycle of the M counter. Each time the M counter reaches 0, the comparator 157 also causes the A counter to reload value 166. From a mathematical point of view, the circuitry described above implements the following formula: $D=((M+1)-(8-A))*8+(8-A)*7$.

The prescaler module 100 has the M counter and A counter set as described above, except when the divide ratio is set at 48. At a divide ratio of 48, the normal hardware design would attempt to solve for an unnatural solution, so additional circuitry is used to configure the counters to provide a divide ratio of 48. More particularly, the prescaler module 100 has exception circuitry 161. The exception circuitry 161 is set to detect when the divide ratio is set to 48, and in response, force the most significant bit of the A counter to 0 and force the value 5 (00101) to be loaded in the M counter. When the divide ratio is set to any value other than 48, the exception of circuitry causes the most significant bit of the A counter to be loaded with 1.

For example, the operation of counter system 150 is described below when the divide ratio is received as 53.

TABLE 1

| | | |
|---|---|---|
| 1. | The divide ratio 53, as an 8 bit binary number: | 00110101 (53) |
| 2. | The most significant 5 bits of the divide ratio 164 are set as value M 165: | 00110 (6) |
| 3. | The most significant bit of A 166 is 1, the least significant 3 bits of the divide ratio are set as the 3 least significant bits of A 166 | 1 + 101 (5) |
| 4. | The counters follow the following progression: | |

| Cycle | M | D | A | VCO Pulses | F Out |
|---|---|---|---|---|---|
| a. load | 00110(6) | 1 | 101(5) | 7 | 1 |
| b. | 00101(5) | 1 | 110(6) | 7 | 1 |
| c. | 00100(4) | 1 | 111(7) | 7 | 1 |
| d. | 00011(3) | 0 | 000(0) | 8 | 0 |
| e. | 00010(2) | 0 | 000(0) | 8 | 0 |
| f. | 00001(1) | 0 | 000(0) | 8 | 0 |
| g. | 00000(0) | 0 | 000(0) | 8 | 0 |
| repeat a through g | | | | | |

Referring to table 1, above, the divide ratio received from a transmit/receive controller is set at 53. The divide ratio, 53, is provided as an 8 bit binary number. The M counter is loaded with the 5 most significant bits of the divide ratio, which represent the decimal number 6. The A counter, which has a 4 bit counter input, has the three least significant bits set according to the 3 least significant bits of the divide ratio, which represent the decimal number 5. The most significant bit of the A counter is set at 1, since the exception circuitry 161 generates a "1" output when the divide ratio is not 48. As shown in line "a" of Table 1, at a first cycle, the M counter is loaded with 00110 and the A counter is loaded with 1101. Since the divide-by-7 signal 173 is the most significant bit of the counter output, the divide-by-7 signal 173 is high, so the prescaler will be directed to generate a pulse representing 7 pulses from the VCO. The output signal 171 (F Out) is still latched at 1, so the output signal remains high. In cycle "b", the M counter decrements to 00101(5), and the A counter increments to 1110. The MSB of the A counter is still set to 1, so the divide-by-7 signal is also still high, which causes the pulse from the prescaler to represent 7 pulses. The output 171 remains latched at 1. In cycle "c", the M counter decrements to 00100(4), and the A counter increments to 1111. The MSB of the A counter is still set to 1, so the divide-by-7 signal is also still high, which causes the pulse from the prescaler to represent 7 pulses. Since the output from the M counter is now decimal 4, the comparator 159 generates a signal to reset the flip-flop 171, which will transition the output 171 to 0, or low, on the next clock rising edge.

In cycle "d", the M counter decrements to 00011(3), and the A counter rolls over to 0000. The MSB of the A counter is now set to 0, so the divide-by-7 signal is low, which causes the pulse from the prescaler to represent 8 pulses. The output 171 has transitioned at 0. In cycle "e", the M counter decrements to 00010(2), and the A counter advances to 0001. The MSB of the A counter is still set to 0, so the divide-by-7 signal is low, which causes the pulse from the prescaler to represent 8 pulses. The output 171 remains latched at 0. In cycle "f", the M counter decrements to 00001(1), and the A counter advances to 0010. The MSB of the A counter is still set to 0, so the divide-by-7 signal is low, which causes the pulse from the prescaler to represent 8 pulses. The output 171 remains latched at 0. In cycle "g", the M counter decrements to 00000(0), and the A counter advances to 0011. The MSB of the A counter is still set to 0, so the divide-by-7 signal is low, which causes the pulse from the prescaler to represent 8 pulses. However, since the output from the M counter is now decimal 0, the comparator 157 generates a data signal to the flip-flop 169, which transitions the output 171 to 1, or high, on the next clock rising edge. The comparator 157 is also coupled to the load inputs of both counters, so on the next clock rising edge both counters will reload, and the cycle a to g repeats.

F out 171 is therefore a periodic pulse that has a rising edge associated with the M counter reaching 0. Each periodic pulse represents 53 VCO clock pulses (7+7+7+8+8+8+8), so effectively divides the input frequency signal by 53. This process of loading and using the A and M counters works for all divide ratios of greater than or equal to 42, except for a divide ratio of 48. It will be appreciated that the logic implemented by the flip-flops may be adjusted consistent with this teaching. For example, other types of flip-flops or other logic gates may be used to implement a result as described above. Such revisions to the circuit and logic are to be considered within the scope of this application.

At a divide ratio of 48, in the absence of the exception circuitry, the following would apply:

TABLE 2

1. The divide ratio 48, as an 8 bit binary number: 00110000 (48)
2. The most significant 5 bits of the divide ratio are set as value M 164: 00110 (6)
3. The most significant bit of A 166 is 1, while the least significant 3 bits of the divide ratio are set as the 3 least significant bits of A 166: 1 + 000 (0)
4. The counters follow the following progression:

| Cycle | M | D | A | VCO Pulses | F Out |
|---|---|---|---|---|---|
| a. load | 00110(6) | 1 | 000(0) | 7 | 1 |
| b. | 00101(5) | 1 | 001(1) | 7 | 1 |
| c. | 00100(4) | 1 | 010(2) | 7 | 1 |
| d. | 00011(3) | 1 | 011(3) | 7 | 0 |
| e. | 00010(2) | 1 | 100(4) | 7 | 0 |
| f. | 00001(1) | 1 | 101(5) | 7 | 0 |
| g. | 00000(0) | 1 | 110(6) | 7 | 0 |
| repeat a through g | | | | | |

As shown in Table 2, when the divide ratio is set to 48, in the absence of the exception circuitry, the circuit does not perform a divide-by-48 function. Instead, the MSB of the A counter remains high, so the divide-by-7 signal is always high, and the M counter decrements from 6 to 0, so 7 cycles (a-g) comprise each periodic pulse. In this way, each periodic pulse of F out 171 represents 49 VCO pulses, instead of 48.

To cause the prescaler 100 to properly perform the divide-by-48 function, the exception circuitry forces the counters to load according to the following:

TABLE 3

1. The divide ratio 48 is detected as an exception value (00110000)
2. The M counter is loaded with value 5 (00101)
3. The most significant bit of A166 is 0; while the least significant 3 bits of the divide ratio are set as the 3 least significant bits of A 166: 0 + 000 (0)
4. The counters follow the following progression:

| Cycle | M | D | A | VCO Pulses | F Out |
|---|---|---|---|---|---|
| a. load | 00101(5) | 0 | 000(0) | 8 | 1 |
| b. | 00100(4) | 0 | 000(0) | 8 | 1 |
| c. | 00011(3) | 0 | 000(0) | 8 | 0 |
| d. | 00010(2) | 0 | 000(0) | 8 | 0 |
| e. | 00001(1) | 0 | 000(0) | 8 | 0 |
| f. | 00000(0) | 0 | 000(0) | 8 | 0 |
| repeat a through f | | | | | |

As shown in Table 3, when the exception circuit detects the value 48, the counters are forced into a condition to implement 6 cycles (a-f) of 8 clock pulses. Each periodic pulse represents 8 VCO clock pulses (8+8+8+8+8+8), so effectively divides the input frequency signal by 48.

Any natural number can be written as D=M*8+A, where M and A are natural, and A is 0 to 7. However, the 7/8 prescaler implements the division algorithm of D=((M+1)−(8−A)*8+(8−A)*7. As with known prescalers, when M is greater than or equal 7, there is always a natural solution for the division ratio of 56 or greater. However, the 7/8 prescaler extends the solutions to minimum division ratio of 42. In this way, the 7/8 prescaler enables division in the range from 42 to 55, as shown in the table below:

| Division Ratio | M | A | Comment |
|---|---|---|---|
| 55 | 6 | 7 | |
| 54 | 5 | 6 | |
| 53 | 4 | 5 | |
| 52 | 3 | 4 | |
| 51 | 2 | 3 | |
| 50 | 1 | 2 | |
| 49 | 0 | 1 | |
| 48 | force 6 | * 8 | exception value |
| 47 | 5 | 7 | |
| 46 | 4 | 6 | |
| 45 | 3 | 5 | |
| 44 | 2 | 4 | |
| 43 | 1 | 3 | |
| 42 | 0 | 2 | minimum division value |

The table above shows that, for the 7/8 prescaler, the number 48 is an exception value. The number 48 can be written as M*8+A, where M=6 and A=0. Applying the formula implemented in the hardware ((M+1)−(8−A)*8+(8−A)*7, result in: ((6+1)−(8−0)*8+(8−0)*7=(−1)*8+8*7. This formula mathematically equals 48, but from a practical prospective it is not possible to divide (−1) times by 8, so without the exception circuitry the prescaler will produce an erroneous result. Instead, by using the exception circuitry which detects the division ratio of 48, the exception circuit forces the M counter to be loaded with 5 and inhibit the A counter (by clearing the MSB of A). This causes the M and A counters to divide 6 times by 8, which is the desired divide ratio of 48.

Figure 5:
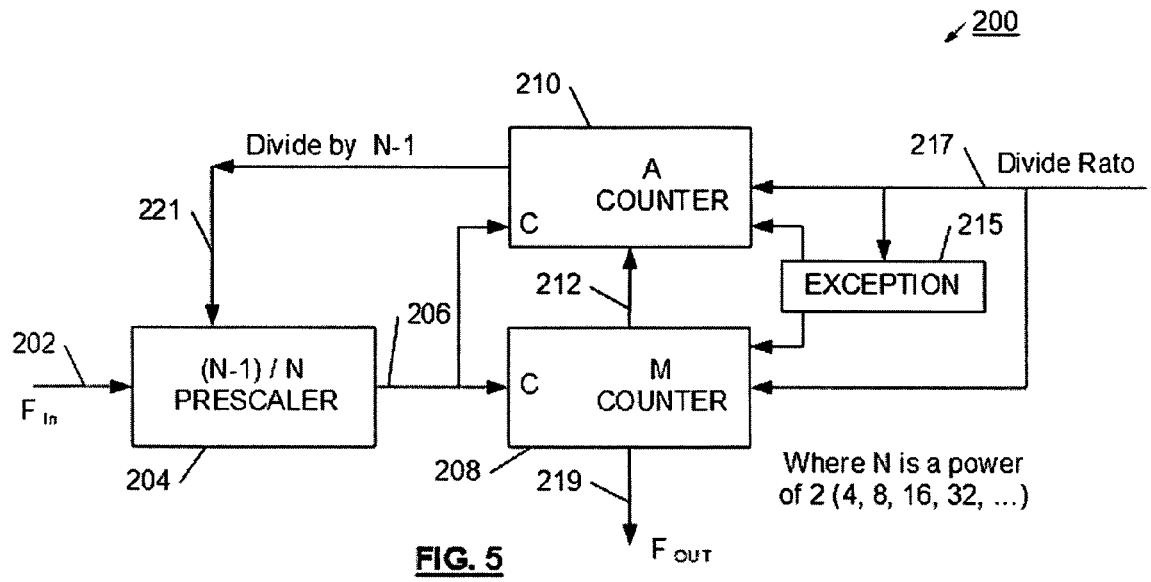
FIG. 5 is a block diagram of a prescaler and counter system in accordance with the present invention.

Referring now to FIG. 5, a prescaler system 200 is illustrated. Prescaler system 200 receives an input signal 202 from a high frequency source, such as a voltage controlled oscillator (VCO). The input signal 202 is divided in a prescaler 204 by a factor of either (N−1) or N, responsive to a signal 221. N is set to so that $N=2^S$, where S is a positive integer. For example,

- if S=2, then N=4 and (N−1)=3, resulting in a 3/4 prescaler;
- if S=3, then N=8 and (N−1)=7, resulting in a 7/8 prescaler;
- if S=4, then N=16 and (N−1)=15, resulting in a 15/16 prescaler; and
- if S=5, then N=32 and (N−1)=31, resulting in a 31/32 prescaler.

It will be appreciated that other values of S, N, and (N−1) may be used according to the requirements of advancing hardware components and communication standards.

The output 206 from the prescaler 204 is received as the clock inputs to a set of counters. The counters may include an M counter 208 and an A counter 210. A divide ratio 217 is received from supporting circuitry such as a transmit/receive controller. The divide ratio 217 is used to set the particular values in the counters 208 and 210 to implement the desired divide ratio. The prescaler 204 divides by a factor of N−1 until the divide-by-(N−1) signal 221 is deasserted. Upon deasserting the divide-by-(N−1) signal 221, the prescaler 204 divides the input frequency 202 by a factor of N. The counters generate an output signal 219 which implements the divide ratio 217. The prescaler system 200 may also include exception circuitry 215. The exception circuitry 215 detects when the divide ratio 217 is set to a value where the normal process of setting the counters fails to implement a natural solution. The exception circuitry 215 forces the counters 208 and 210 into a condition to implement the desired divide ratio 217. The following identifies the exception divide ratio for common ratios:

- For a 3/4 prescaler: 8
- For a 7/8 prescaler: 48
- For a 15/16 prescaler: 224

For a (N−1)/N prescaler system 200, the normal process of setting the counters is not effective for a divide ratio as defined above. More particularly, if the counters are set in their usual manner, an unnatural or incorrect solution results. Accordingly, the exception circuitry 215 is set to detect when the divide ratio is a set at the exception value, and force the counters 208 and 210 into a condition to implement the desired divide ratio.

Figure 6:
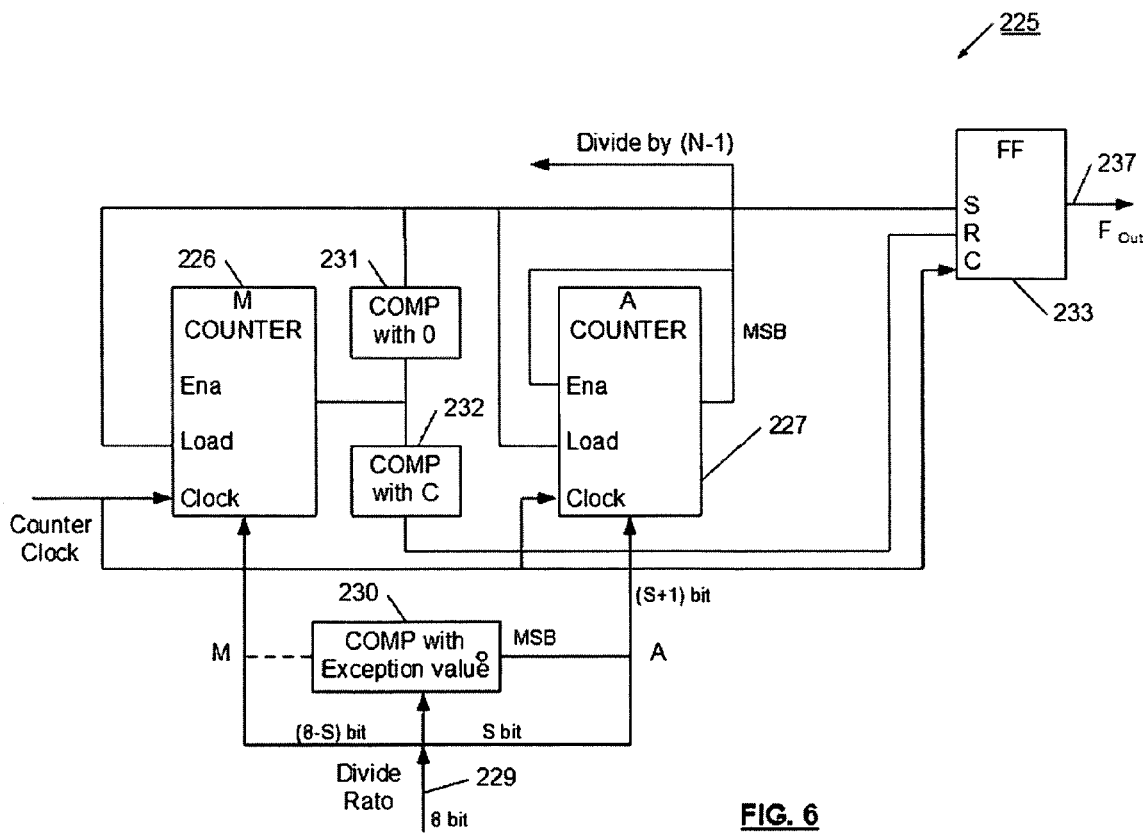
FIG. 6 is a schematic diagram of a counter in accordance with the present invention.

In operation, the counters for prescaler system 200 may be implemented as shown by counters 225 illustrated in FIG. 6. The counter system 225 may have an M counter 226 and an A counter 227, as generally described with reference to FIG. 4. The divide ratio 229 for the (N−1)/N counter is received as an 8 bit binary number. The least significant S bits are used as inputs to the A counter 227, which has an S+1 MSB (most significant bit) that is set according to the exception circuitry 230. The remaining (8-S) bits of the divide ratio (considering that the division ratio is an 8 bit number, although it will be appreciated that other numbers of bits may be used) are used to load the M counter 226. Comparators 231 and 232 are used to transition the flip-flop 233 to generate a periodic output signal 237. The comparator 231 is generally arranged to detect when the M counter 226 has reached 0, and in response, reload the M counter 226 and the A counter 227, as well as cause the FOut signal 237 to transition to a high state at the next clock cycle. In this way, the rising edge of the FOut signal 237 always occurs on the next clock cycle after the M counter reaches 0. However, it will be appreciated the falling edge of FOut 237 may be set according to the value C set in comparator 232. It will also be appreciated that the value C in comparator 232 may be adjusted according to the value of N used in the prescaler.

For example, a 7/8 prescaler generates an FOut signal having an acceptable output pulse when the comparator 232 is set at C=4. To support application specific requirements, other values of C may be used to adjust the shape of the output pulse. For example, for a 7/8 prescaler, values of 1, 2, 3, or 5 may provide acceptable output forms. The value C in the comparator 232 must be selected to be less or equal than the minimum value used in the M counter, so M counter will reach it while decrementing to 0. For a 3/4 prescaler, if C is constant, it should be set at C=1 (since the minimum value which can be loaded in M is 1). For a 15/16 prescaler, setting the comparator at C=4 generates an acceptable duty cycle, but other values for C may be used to produce other duty cycles.

Figure 7:
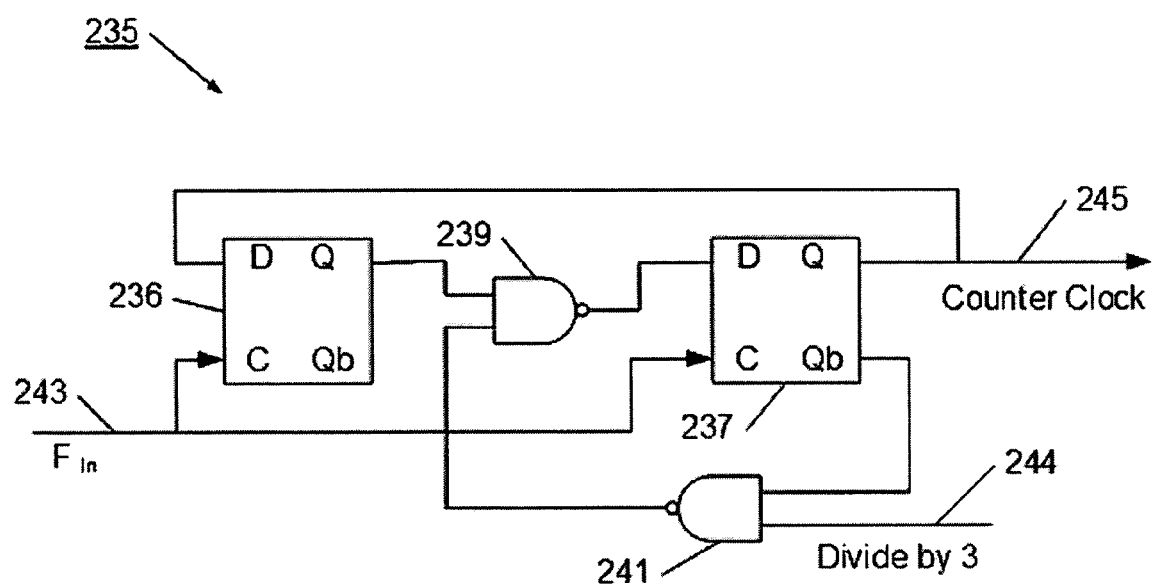
FIG. 7 is a schematic diagram of a prescaler in accordance with the present invention.

FIG. 7 shows the (N−1)/N prescaler as a 3/4 prescaler 235. Prescaler 235 may be implemented using only 2 D flip-flops (236 & 237) and 2 NAND gates (239 & 241). As generally known in the electronic arts, a D flip-flop operates so that when its clock input rises to logic 1, and the outputs can change state, the new output Q takes on the state of the D input at the moment of the clock edge. The design and use of D flip-flops is well known, so will not be discussed in detail. In prescaler 235, an input frequency 243 is received as the clock input to flip-flops 236 and 237. The output from the flip-flop 236 is received into NAND gate 239. The output from NAND gate 239 is received as the data input to flip-flop 237. The Q output from flip-flop 237 generates a counter clock signal 245, which is sent to associated counter circuitry (not shown). The Qb output from flip-flop 237 is received as one of the inputs to NAND gate 241. The other input to NAND gate 241 is a divide-by-3 signal 244 which is received from the associated counter circuitry. The output from the NAND gate 241 is used as an input to the NAND gate 239. In operation, the 2 flip-flops cooperate to implement a divide-by-4 divide factor. However, when a divide-by-3 signal 244 is received, and the Qb of flip-flop 237 is high (Q is low), then the output from NAND gate 241 transitions to a low logic value. The low state from NAND 241 causes the output from NAND 239 to be held at a high state, irrespective of the output from flip-flop 236. This action causes the prescaler module 235 to divide by a factor of 3 while the divide-by-3 signal 244 is high. Otherwise, when signal 244 is low, the prescaler divides by a factor of 4.

Prescaler module 235 may be used, for example, as part of a prescaler system, such as a prescaler system for use with a wireless radio system. Prescaler module 235 is arranged to implement a 3/4 prescaler. Advantageously, the 3/4 prescaler 235 is implemented using only 2 flip-flops, along with some supporting logic gates and circuitry. Further, the 3/4 prescaler 235 is capable of implementing a minimum division ratio of 6, which extends the utility out of the prescaler module 235. Since the 3/4 prescaler 235 uses fewer flip-flops than known designs, the 3/4 prescaler 235 has better overall performance and reduced timing requirements. Also, the reduced component count allows the prescaler 235 to be implemented in less space, and uses less power, than known designs.

Figure 8:
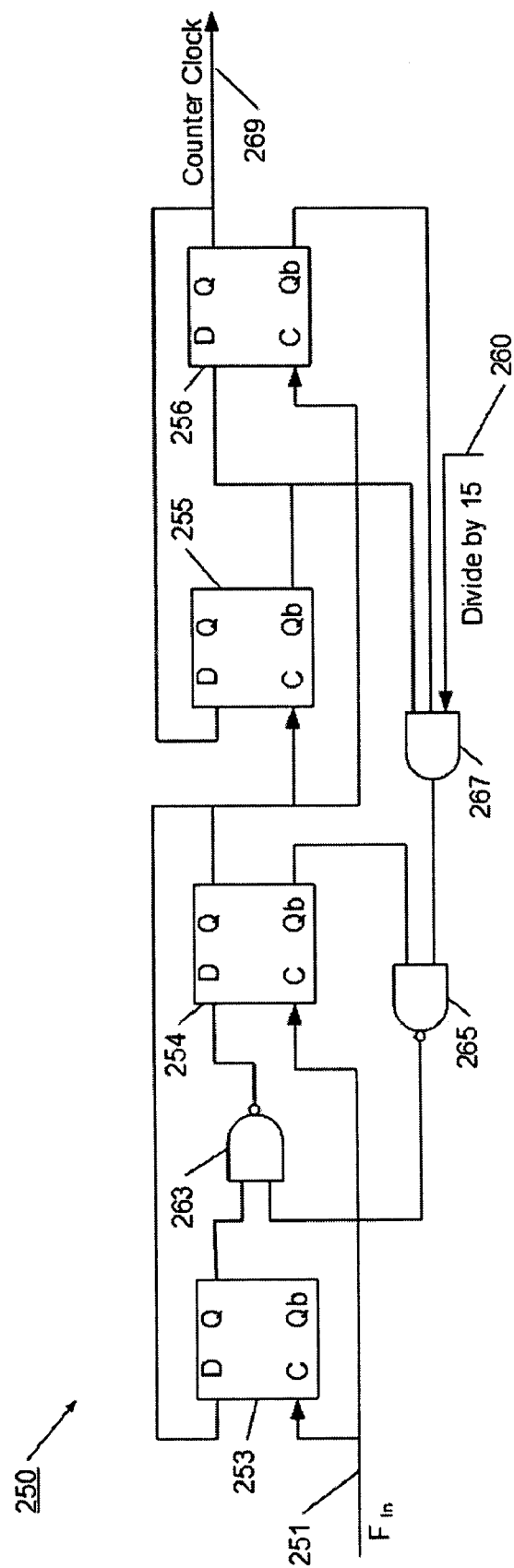
FIG. 8 is a schematic diagram of a prescaler in accordance with the present invention.

FIG. 8 shows the (N−1)/N prescaler as a 15/16 prescaler 250. Prescaler 250 may be implemented using only 4 D flip-flops (253, 254, 255 & 256), 2 NAND gates (263 & 265), and 1 AND gate (267). Advantageously, only 2 of the flip-flops operates at the VCO frequency. As generally known in the electronic arts, a D flip-flop operates so that when its clock input rises to logic 1, and the outputs can change state, the new output Q takes on the state of the D input at the moment of the clock edge. The design and use of D flip-flops is well known, so will not be discussed in detail. In prescaler 250, an input frequency 251 is received as the clock input to flip-flops 253 and 254. The output from the flip-flop 253 is received into NAND gate 263. The output from NAND gate 263 is received as the data input to flip-flop 254. The Q output from flip-flop 254 provides the clock input for flip-flops 255 and 256, as well as the data input to flip-flop 253. The Qb output from flip-flop 255 is received as one of the inputs to AND gate 267. A second input to AND gate 267 is the Qb output from flip-flop 256. The Q output from flip-flop 256 generates a counter clock signal 269, which is sent to associated counter circuitry (not shown). The other input to AND gate 267 is a divide-by-15 signal 260 which is received from the associated counter circuitry. The output from the AND gate 267 is used as an input to the NAND gate 265, with its other input coming from the Qb output of flip-flop 254. The output of NAND gate 254 is received as an input to NAND gate 263. In operation, the 4 flip-flops cooperate to implement a divide-by-16 divide factor. However, when a divide-by-15 signal 260 is received, the prescaler module 250 divides by a factor of 15.

Prescaler module 250 may be used, for example, as part of a prescaler system, such as a prescaler system for use with a wireless radio system. Prescaler module 250 is arranged to implement a 15/16 prescaler. Advantageously, the 15/16 prescaler 250 is implemented using only 4 flip-flops, along with some supporting logic gates and circuitry. Only 2 of the flip-flops operate at full VCO clock speed. Further, the 15/16 prescaler 250 is capable of implementing a minimum division ratio of 210, which extends the utility out of the prescaler module 250. Since the 15/16 prescaler 250 uses fewer flip-flops than known designs, the 15/16 prescaler 250 has better overall performance and reduced timing requirements. Also, the reduced component count allows the prescaler 250 to be implemented in less space, and uses less power, than known designs.

Although 3/4, 7/8, and 15/16 prescalers have been presented, it will be understood that other (N−1)/N prescalers may be implemented, each having an extended divide range and fewer flip-flops as compared to known designs. Accordingly, the (N−1)/N prescalers would have better overall performance and reduced timing requirements. Also, the reduced component count allows the (N−1)/N prescaler to be implemented in less space, and uses less power, than known designs.

Figure 9:
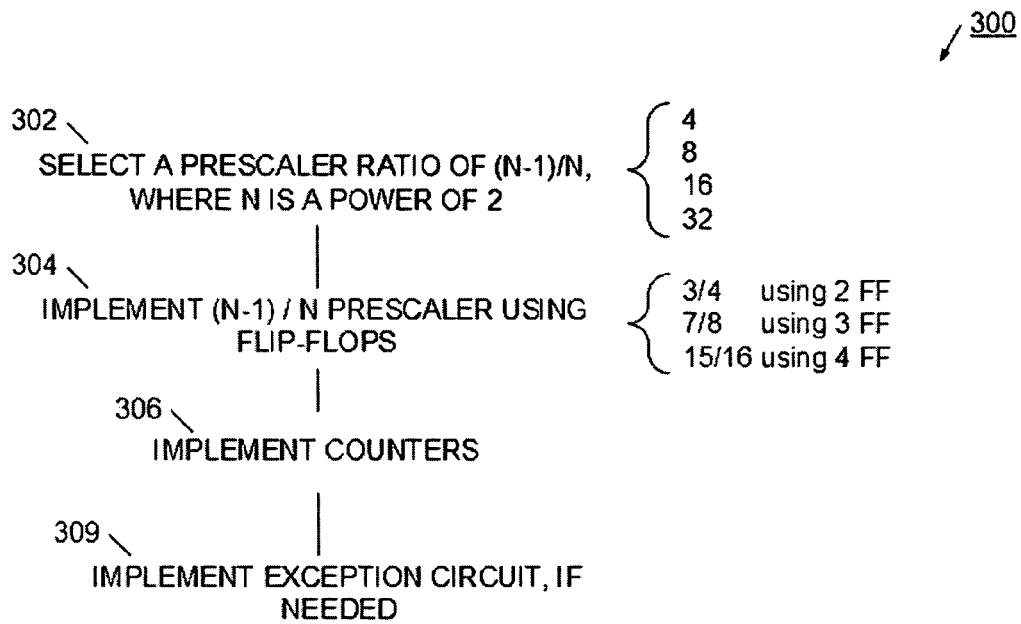
FIG. 9 is a flowchart of a prescaler process in accordance with the present invention.

Referring now to FIG. 9, a prescaler process 300 is illustrated. In prescaler process 300, a prescaler ratio is selected as shown in block 302. The prescaler ratio is in the form (N−1)/N, where N is a power of 2. For example, N may be 4, 8, 16, or 32. In this way, the prescaler ratio could be, for example, 3/4; 7/8; 15/16; or 31/32. It will be appreciated that other prescaler ratios may be used. The prescaler ratio is then implemented using only the set number of flip-flops as shown in block 304. The prescaler may be advantageously implemented using fewer flip-flops than in known designs. For example, a 3/4 prescaler may be implemented using only 2 flip-flops and associated logic gates. In another example, a 7/8 prescaler may be implemented using only 3 flip-flops and associated logic gates, while a 15/16 prescaler may be implemented using only 4 flip-flops and associated logic gates. The (N−1)/N prescaler is then coupled to a counter system as shown in block 306. The counters receive a clock output from the prescaler, and the prescaler receives a divide by (N−1) signal from the counters. For some divide ratios, the prescaler and counters may implement exception circuitry as shown in block 309. For example, a divide ratio of 48 may need exception circuitry to properly set counters in a 7/8 prescaler designed according to process 300. Other prescaler ratios may have other exception values.

Figure 10:
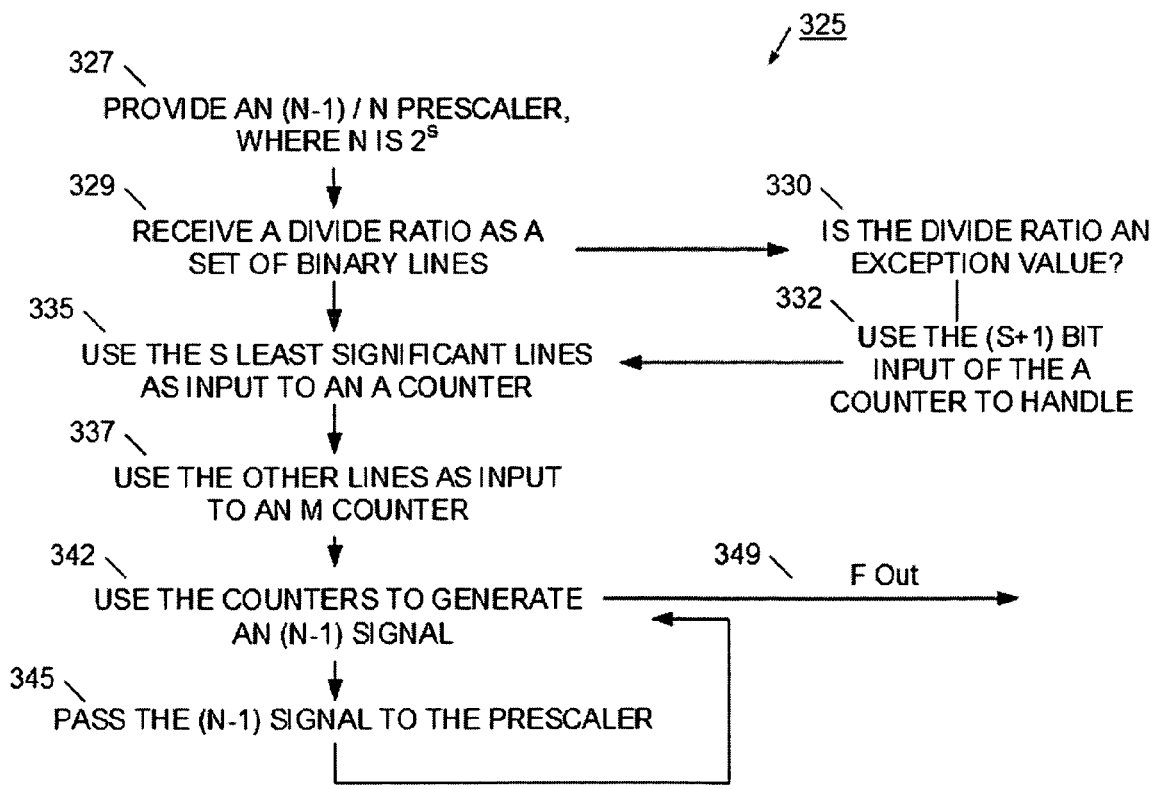
FIG. 10 is a flowchart of a prescaler process in accordance with the present invention.

Referring now to FIG. 10, a prescaler process 325 is illustrated. In prescaler process 325, an (N−1)/N prescaler is provided as shown in block 327. In the prescaler, N is set so that $N=2^S$, and S is a positive integer. A divide ratio is provided from supporting circuitry, such as a transmit/receive module for a radio device. The divide ratio is received as a set of binary lines, for example, an 8 bit binary word as shown in the block 329. The S least significant lines are used as an input to an A counter, as shown in block 335. Exception circuitry is used to set an (S+1) input line to the A counter. If the desired divide ratio is an exception value as shown in block 330, then the exception circuitry sets the (S+1) bit to 0, as shown in block 332. In this way, the A counter is disabled from generating a divide-by-(N−1) signal. This action causes the (N−1)/N prescaler to implement the desired exception divide ratio. It will be appreciated that other arrangements may be used to set the counters when an exception value is desired.

In process 325, S least significant bits of the divide ratio are used as inputs to set the A counter. The remaining lines are used as an input to set an M counter as shown in block 337. The counters cooperate to generate a divide-by-(N−1) signal as shown in block 342. The divide-by-(N−1) signal is passed to a prescaler, which sets its divide factor according to the signal as shown in block 345. The counters also cooperate to generate an output signal 348. The output signal

348 is a periodic signal having a frequency equal to an input frequency divided by the divide ratio.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. An (N−1)/N prescaler, where N is an S power of 2, comprising:
   S, and only S, flipflops;
   an input line for clocking at least one of the flipflops;
   an output line for connection to a counter;
   a divide-by-(N−1) input line for receiving a divide by (N−1) signal from the counter; and
   wherein the prescaler normally divides by N, except, responsive to the divide-by-(N−1) signal, divides by (N−1).

2. The prescaler according to claim 1, where S is 3, N is 8, and (N−1) is 7.

3. The prescaler according to claim 1, where S is 2, N is 4, and (N−1) is 3.

4. The prescaler according to claim 1, where S is 4, N is 16, and (N−1) is 15.

5. A 7/8 prescaler, comprising:
   three, and only three, flipflops;
   an input line for clocking at least two of the flipflops;
   an output line for connection to a counter
   a divide-by-seven input line for receiving a divide-by-seven signal from the counter; and
   wherein the prescaler normally divides by 8, except, responsive to the divide-by-seven signal, divides by 7.

6. The 7/8 prescaler according to claim 5, further comprising three, and only three, logic gates.

7. The 7/8 prescaler according to claim 6, where the three logic gates consist of 2 NAND gates and 1 AND gate.

8. The 7/8 prescaler according to claim 5, further comprising two, and only two, logic gates where the two logic gates consist of 12-input NAND gate and 13-input NAND gate.

9. An (N−1)/N prescaler system, where N is an S power of 2, comprising:
   an (N−1)/N prescaler;
   a reference input line connected to the prescaler;
   a divide-by-(N−1) input line connected to the prescaler;
   a prescaler output line connected to a counter, the counter further comprising:
   a ratio input line for receiving a set of binary lines;
   a first counter connected to the S least significant binary lines;
   a second counter connected to the remaining binary lines; and
   wherein the first and second counters are operably coupled to enable the first counter to generate a periodic divide-by-(N−1) signal.

10. The (N−1)/N prescaler system according to claim 9, wherein the ratio input line is connected to an exception circuit, the exception circuit constructed to detect when the ratio line has a ratio for which the counters are not able to provide a natural solution.

11. The (N−1)/N prescaler system according to claim 10, wherein the first counter is connected to the exception circuit.

12. The (N−1)/N prescaler system according to claim 9, wherein S is 3, N is 8, and (N−1) is 7.

13. The 7/8 prescaler system according to claim 12, wherein the ratio input line is connected to an exception circuit, the exception circuit constructed to detect when the ratio line has a ratio of 48.

14. The 7/8 prescaler system according to claim 13, wherein the first counter is connected to the exception circuit, and when the ratio is set to 48, the exception circuit causes the first counter not to generate the divide by 7 signal.

15. The (N−1)/N prescaler system according to claim 9, wherein S is 2, N is 4, and (N−1) is 3.

16. The 3/4 prescaler system according to claim 15, wherein the ratio input line is connected to an exception circuit, the exception circuit constructed to detect when the ratio line has a ratio of 8.

17. The 3/4 prescaler system according to claim 16, wherein the first counter is connected to the exception circuit, and when the ratio is set to 8, the exception circuit causes the first counter not to generate the divide by 3 signal.

18. The (N−1)/N prescaler system according to claim 9, wherein S is 4, N is 16, and (N−1) is 15.

19. The 15/16 prescaler system according to claim 18, wherein the ratio input line is connected to an exception circuit, the exception circuit constructed to detect when the ratio line has a ratio of 224.

20. The 15/16 prescaler system according to claim 19, wherein the first counter is connected to the exception circuit, and when the ratio is set to 224, the exception circuit causes the first counter not to generate the divide by 15 signal.

* * * * *